(12) United States Patent
Hu et al.

(10) Patent No.: US 6,525,384 B2
(45) Date of Patent: Feb. 25, 2003

(54) CONDUCTOR LAYER NITRIDATION

(75) Inventors: Yongjun Hu, Boise, ID (US); Randhir P. S. Thakur, Boise, ID (US); Scott DeBoer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/131,993

(22) Filed: Aug. 11, 1998

(65) Prior Publication Data

US 2002/0008292 A1 Jan. 24, 2002

Related U.S. Application Data

(62) Division of application No. 08/802,861, filed on Feb. 19, 1997, now Pat. No. 5,926,730.

(51) Int. Cl.[7] .............................................. H01L 31/119
(52) U.S. Cl. ..................... 257/411; 257/406; 257/412; 257/413; 257/639; 257/640; 257/767; 257/914; 257/915
(58) Field of Search .................... 257/411–413, 388, 257/406, 635, 640, 649, 754, 767, 914, 915, 288

(56) References Cited

U.S. PATENT DOCUMENTS

| | | | |
|---|---|---|---|
| 4,755,865 A | 7/1988 | Wilson et al. ................ 357/63 |
| 4,774,204 A | 9/1988 | Havemann .................. 437/54 |
| 4,784,973 A | 11/1988 | Stevens et al. ............. 437/200 |
| 4,897,365 A | * 1/1990 | Kobushi et al. ............. 437/200 |
| 4,897,368 A | 1/1990 | Kobushi et al. ............. 437/200 |
| 4,923,822 A | 5/1990 | Wang et al. ................. 437/41 |
| 4,935,804 A | * 6/1990 | Ito et al. ...................... 357/71 |
| 5,234,794 A | 8/1993 | Sebald et al. ............... 430/325 |
| 5,381,302 A | 1/1995 | Sandhu et al. ............. 361/305 |
| 5,397,744 A | 3/1995 | Sumi et al. ................. 437/200 |
| 5,534,713 A | 7/1996 | Ismail et al. ................ 257/24 |
| 5,545,574 A | 8/1996 | Chen et al. .................. 437/40 |
| 5,545,581 A | * 8/1996 | Armacost et al. ............ 437/52 |
| 5,569,947 A | 10/1996 | Iwasa et al. ............... 257/336 |
| 5,633,200 A | * 5/1997 | Hu ............................ 438/653 |
| 5,650,648 A | 7/1997 | Kapoor ...................... 257/316 |
| 5,668,394 A | 9/1997 | Lur et al. ................... 257/413 |
| 5,682,055 A | 10/1997 | Huang et al. .............. 257/408 |
| 5,710,438 A | 1/1998 | Oda et al. .................... 257/69 |
| 5,723,893 A | 3/1998 | Yu et al. .................... 257/413 |
| 5,728,625 A | 3/1998 | Tung ......................... 438/586 |
| 5,796,151 A | * 8/1998 | Hsu et al. .................. 257/410 |
| 5,874,353 A | * 2/1999 | Lin et al. ................... 438/592 |
| 5,945,719 A | * 8/1999 | Tsuda ........................ 257/413 |

OTHER PUBLICATIONS

Beyers, R., et al., "Titanium disilicide formation on heavily doped silicon substrates", *Journal of Applied Physics*, vol. 61, No. 11, 5110–5117, (Jun. 1, 1987).

Hosoya, T., et al., "A Polycide Gate Electrode with a Conductive Diffusion Barrier Formed with ECR Nitrogen Plasma for Dual Gate CMOS", *IEEE Transactions on Electron Devices*, 42, No. 12, pp. 2111–2116, (Dec. 1995).

Ito, T., et al., "A Nitride–Isolated Molybdenum–Polysilicon Gate Electrode for MOS VLSI Circuits", *IEEE Transactions on Electron Devices*, vol. ED–33, No. 4, 464–468, (Apr. 1986).

(List continued on next page.)

*Primary Examiner*—Eddie Lee
*Assistant Examiner*—Matthew E. Warren
(74) *Attorney, Agent, or Firm*—Schwegman, Lundberg, Woessner & Kluth, P.A.

(57) ABSTRACT

Methods and apparatus for forming word line stacks comprise forming a thin nitride layer coupled between a bottom silicon layer and a conductor layer. In a further embodiment, a diffusion barrier layer is coupled between the thin nitride layer and the bottom silicon layer. The thin nitride layer is formed by annealing a silicon oxide film in a nitrogen-containing ambient.

32 Claims, 3 Drawing Sheets

OTHER PUBLICATIONS

Kobushi, K., et al., "A High Integrity and Low Resistance Ti–Polycide Gate Using a Nitrogen Ion–Implanted Buffer Layer", *Japanese Journal of Applied Physics/Part 2: Letters*, 27, No. 11, pp. L2158–L2160, (Nov. 1988).

Pan, P., et al., "Highly Conductive Electrodes for CMOS", *Proc. of the international symposium on ULSI Sci & Tech*, ECS, Inc., Pennington, NJ, 104–109, (1989).

Shimizu, S., et al., "0.15um CMOS Process for High Performance and High Reliability", *IEEE*, pp. 4.1.1–4.1.4, (1994).

* cited by examiner

CONDUCTOR LAYER NITRIDATION

This application is a division of U.S. Ser. No. 08/802,861 filed Feb. 19, 1997 now U.S. Pat. No. 5,926,730.

FIELD OF THE INVENTION

The present invention relates to the manufacture of semiconductor devices, and in particular, to the manufacture of gate structures utilized in advanced semiconductor products, having a nitrided conductor layer.

BACKGROUND

Semiconductor memory devices are comprised of an array of memory cells. Each memory cell is comprised of a capacitor, on which the charge stored represents the logical state of the memory cell. A charged capacitor corresponds to a logical state of "1" and an uncharged capacitor corresponds to a logical state of "0." Word lines activate access transistors, so that the logical state of a memory cell can be read. Gates of multiple transistors are formed as one word line.

An example of a word line's application is in a dynamic random access memory (DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer as a two-layer stack, comprising silicon (or polysilicon), coated with a conductor material. The most common two-layer stack used in the industry is a layer of polysilicon, coated with a tungsten silicide layer. Tungsten silicide is used because of its good integration properties, such as providing good thermal stability, stability during source/drain oxidation, and stability during dry etching, as well as having a low resistivity. Although titanium silicide is approximately 75% less resistive than tungsten silicide, it has not been used extensively in two-layer stacks because it is not as thermally stable. Titanium silicide tends to agglomerate during subsequent high temperature processing steps. Alternatively, a metal is used instead of a silicide for the conductor layer.

Of primary concern is minimizing resistivity throughout the word line, due to the need to reduce RC time constants and access multiple memory cells in as short a period of time as possible. The problem is especially critical due to the extended length of word lines. Diffusion of silicon from the bottom polysilicon layer to the top conductor layer increases the resistivity of the two-layer stack. When silicon diffuses through the stack, it reacts with the conductor layer elements, increasing the resistivity of the conductor layer. When the conductor layer is formed of a metal, suicides are formed, which have a higher resistivity than pure metal.

One previous unsuccessful attempt to solve this diffusion problem introduces a third layer, which acts as a diffusion barrier, between the silicon and conductor layers. For example, a silicon nitride layer is used as the third layer in a two-layer stack. However, the silicon nitride diffusion barrier layer of Ito et al. (IEEE Transactions on Electron Devices, ED-33 (1986), 464 and U.S. Pat. No. 4,935,804) is difficult to employ because it must be ultrathin (less than 3 nanometers thick) to allow tunneling of charges through the layer, yet thick enough to act as a reaction barrier between the polysilicon and conductor layer elements.

Another diffusion barrier used in the past is comprised of a titanium nitride layer interposed between a two-layer stack. The conductive titanium nitride barrier layer of Pan et al. (IBM General Technology Division, "Highly Conductive Electrodes for CMOS") attempts to solve the problems of Ito et al., but it requires a special source/drain (S/D) oxidation process when forming oxide spacers to maintain gate oxide layer integrity. A special process is required due to the tendency for tungsten and titanium nitride to oxidize, resulting in degradation of these layers. This adds time and cost to the fabrication process.

In ultra large scale integrated (ULSI) circuits, a highly conductive word line is necessary to improve circuit density and performance. In order to maintain a highly conductive word line, it is necessary to provide an effective method for decreasing diffusion within the two-layer stack. As devices are scaled down in size, word line widths are also decreased. While smaller line widths result in a decreased amount of resistance, this decrease is more than offset by an increase in resistance due to the longer length of word lines. To date, word line resistance is one of the primary limitations of achieving faster ULSI circuits. A method for decreasing the resistivity of word lines is needed for use in ULSI applications.

In addition to creating a diffusion barrier layer in a two-layer word line stack, another way of decreasing resistance in a word line is by forming a high conductivity film on the word line. Such films are commonly formed of a refractory metal silicide, such as titanium silicide ($TiSi_2$). Titanium is preferably used as the refractory metal component because it has the ability to reduce oxygen, which remains on surfaces in the form of native oxides. Native oxides are reduced to titanium oxide by titanium. Native oxides degrade interface stability, and often cause device failure if not removed.

There is a need to decrease the overall resistivity of a word line stack. One way that this needs to be accomplished is by preventing silicidation at the interface between the bottom silicon layer and the conductor layer in such a stacked structure. While diffusion barrier layers are one attempt to alleviate this problem, additional methods are needed to further decrease the resistivity. One way of preventing silicidation at the interface between the two layers in a word line stack is by forming a thin nitride layer at the interface. Conventionally, this is done by implanting nitrogen at the interface and annealing. However, implantation is not a preferred way of forming such layers, particularly in shallow junctions.

SUMMARY OF THE INVENTION

A method for forming a word line, which is used in ultra-large scale integrated (ULSI) circuits, has a lower resistivity than word lines formed using prior art techniques. In one embodiment of the invention, a thin nitride layer is formed at the interface between a bottom silicon layer and a conductor layer in a word line stack. The nitride layer improves high temperature stability of the conductor layer. Thermal stability of the conductor layer is improved because the nitride layer inhibits uncontrollable, massive silicidation, which results from pin holes, or other defect sites at the interface between the conductor layer and the bottom silicon layer. Furthermore, leakage currents are reduced due to the nitride layer. Using the method of the invention for nitriding the conductor layer/bottom silicon layer interface is preferable to using prior art methods of implanting nitrogen at the interface. Implanted nitrogen is plagued by straggle, which causes problems in shallow junction applications.

DETAILED DESCRIPTION

Figure 1A:
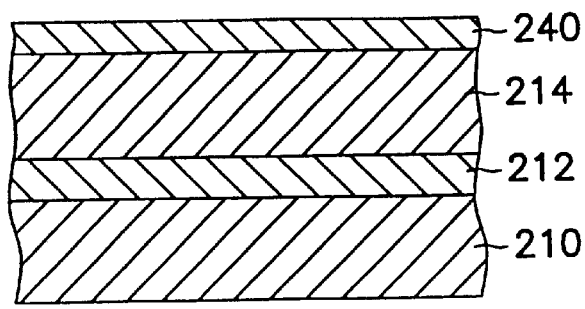
FIGS. 1A–1G are cross-sectional representations of a method for forming a word line stack in accordance with the method of the invention, having a nitrided conductor layer.

A method of lightly nitriding the $TiSi_2/Si$ (or polysilicon) interface through "thin snow-plow" metallization improves high temperature stability of $TiSi_2$. As illustrated in FIG. 1A, an ultrathin (approximately between 20 to 30 angstroms) $SiO_2$ film 240 is grown on the bottom silicon layer 214 of a word line stack, formed over a silicon substrate 210 and gate oxide 212, using rapid thermal oxidation (RTO) processing. For example, using RTO, a thin oxide is grown using an Applied Materials Centura HT (G2) tool in RTO mode. Oxygen is introduced at a pressure of approximately 50 Torr and temperature of approximately 800 to 1,050 degrees Celsius. After approximately 15 to 25 seconds, a 20 to 30 angstrom oxide film 240 is formed. The RTO temperature is reduced if RTO time is increased. These parameters are not meant to be limiting, but are only one way to grow an ultrathin oxide film 240.

Figure 1B:
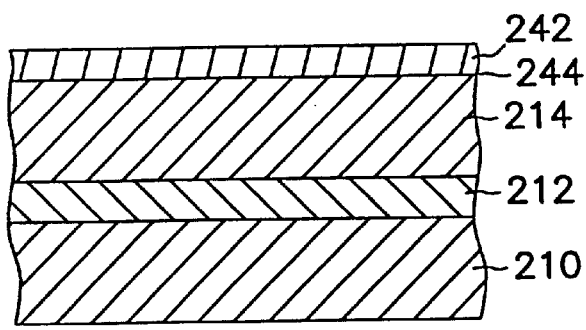

Then, the film 240 is annealed in an $N_2O$, $NH_3$, or NO, ambient, using rapid thermal nitridation (RTN) or plasma nitridation, resulting in a thin film 242, having an increased nitrogen concentration, as shown in FIG. 1B, and a thickness between approximately 20 and 50 angstroms. The nitrogen-containing ambient effectively strengthens thin spots and fills any pin holes, improving uniformity of the oxide film 242. Pin holes, or interface defect sites, are usually sources of uncontrollable, massive silicidation that lead to nonuniform growth of $TiSi_2$. Nonuniform growth of $TiSi_2$ results in an undesirable, higher resistivity silicide film.

The key to obtaining a low resistivity $TiSi_2$ film using this approach, is to have a flat, thin "snow-plow," as described below. A "snow plow" starts with a nitrogen-doped silicon oxide film 242 (approximately less than 20 to 50 angstroms), having a low nitrogen concentration (approximately $10^{13}$ ions/cm$^2$) primarily at the $SiO_2/Si$ (or polysilicon) interface 244, as shown in FIG. 1B. When the RTN step is performed at a temperature of approximately 800 to 1,050 degrees Celsius, the concentration of nitrogen atoms at the $SiO_2/Si$ interface 244 is approximately 1.4% N atoms by volume when using a $N_2O$ ambient and approximately 5.4% N atoms by volume when using a NO ambient. The nitrogen concentration in the film 242 can be determined by a film reflex index. A lower nitrogen content is obtained by varying the annealing temperature and ambient gas used. A higher nitrogen content is achievable by annealing in an ammonia, $NH_3$ ambient. However, usually only a very low nitrogen concentration is needed at the $SiO_2/Si$ interface 244 because too much nitrogen content can inhibit subsequent silicidation.

Figure 1C:
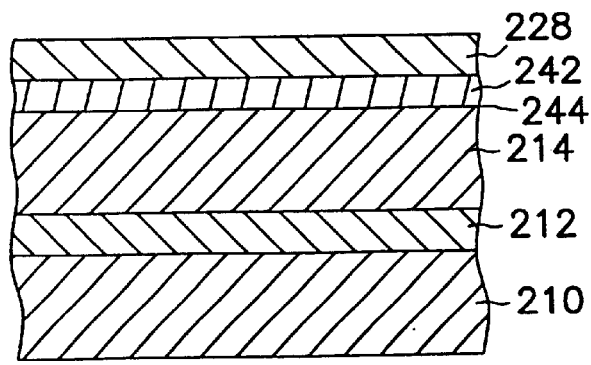
Figure 1D:
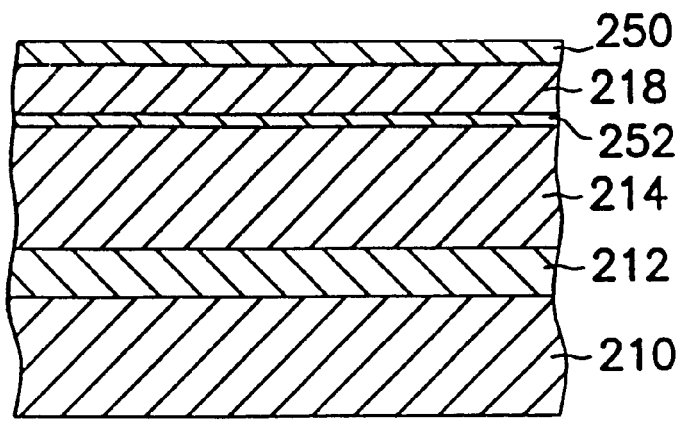

Subsequently, a $TiSi_2$ film is grown by depositing a titanium layer 228, as shown in FIG. 1C, onto the exposed side of the nitrogen-containing $SiO_2$ film 242 and annealing. The thickness of the titanium layer 228 depends on the application, but is typically approximately 400 to 1,500 angstroms. During $TiSi_2$ growth, titanium 228 reduces the oxygen contained in the $SiO_xN_y$ layer 242. As $TiSi_2$ 218 is formed, and the $TiSi_2$ 218 boundary advances, reduced oxygen atoms 250 (i.e., $TiO_x$) are "snow-plowed" towards an outer $TiSi_2$ 218 surface due to more favorable $TiSi_2$ 218 formation, as shown in FIG. 1D. The thickness of the titanium oxide layer 250 formed is not critical, because it is later stripped away, but is typically approximately 5% of the thickness of the titanium silicide layer 218 formed. The "thin snow-plow" phenomenon produces a high quality $TiSi_2$ film 218. The titanium silicide film 218 is approximately 400 to 3,000 angstroms thick. In general, it is typically approximately 2 to 3 times the thickness of the original layer of deposited titanium 228. Only a light nitride layer 252 remains at the $TiSi_2/Si$ (or polysilicon) interface, having a thickness of approximately a few atomic layers.

Thermal stability of $TiSi_2$ 218 is greatly improved by forming a light nitride layer 252 in accordance with this embodiment of the invention, as shown in FIG. 1D. Word lines formed in accordance with this method are thermally stable, up to 200 to 300 degrees Celsius more so than those formed using prior art techniques. However, there is a trade off for improving the thermal stability of a word line using a thin nitride layer 252. The nitride layer 252 increases the resistivity of the word line. However, resistivity of the resulting conductor layer 218 is usually no more than a factor of two larger than conventional silicided $TiSi_2$. Furthermore, this method effectively lowers leakage currents. This method is highly advantageous over implanting nitrogen into the silicon substrate to form a nitride layer. Since nitrogen is a light element, projected straggle during implantation is quite large, even at shallow implantations (i.e., approximately 200 angstroms for a 20 keV implant). Light nitridation using implantation occurs at least in a range of several hundred angstroms. This potentially causes problems for future shallow junction applications.

Figure 1E:
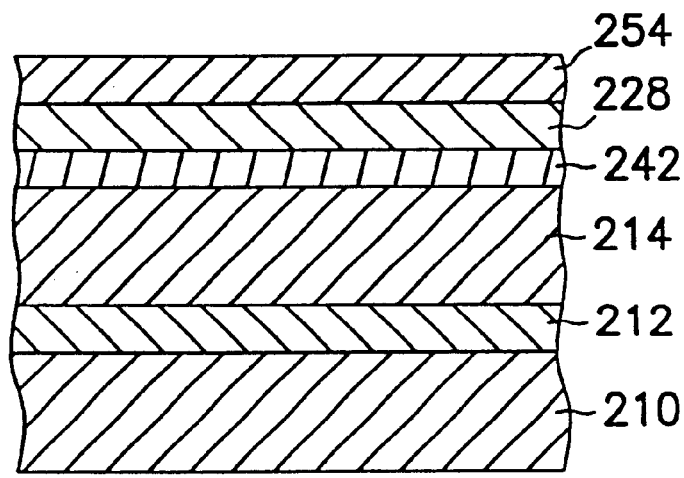
Figure 1F:
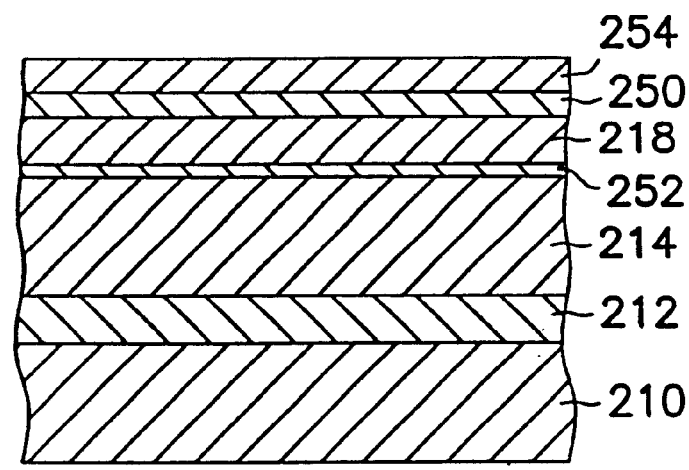
Figure 1G:
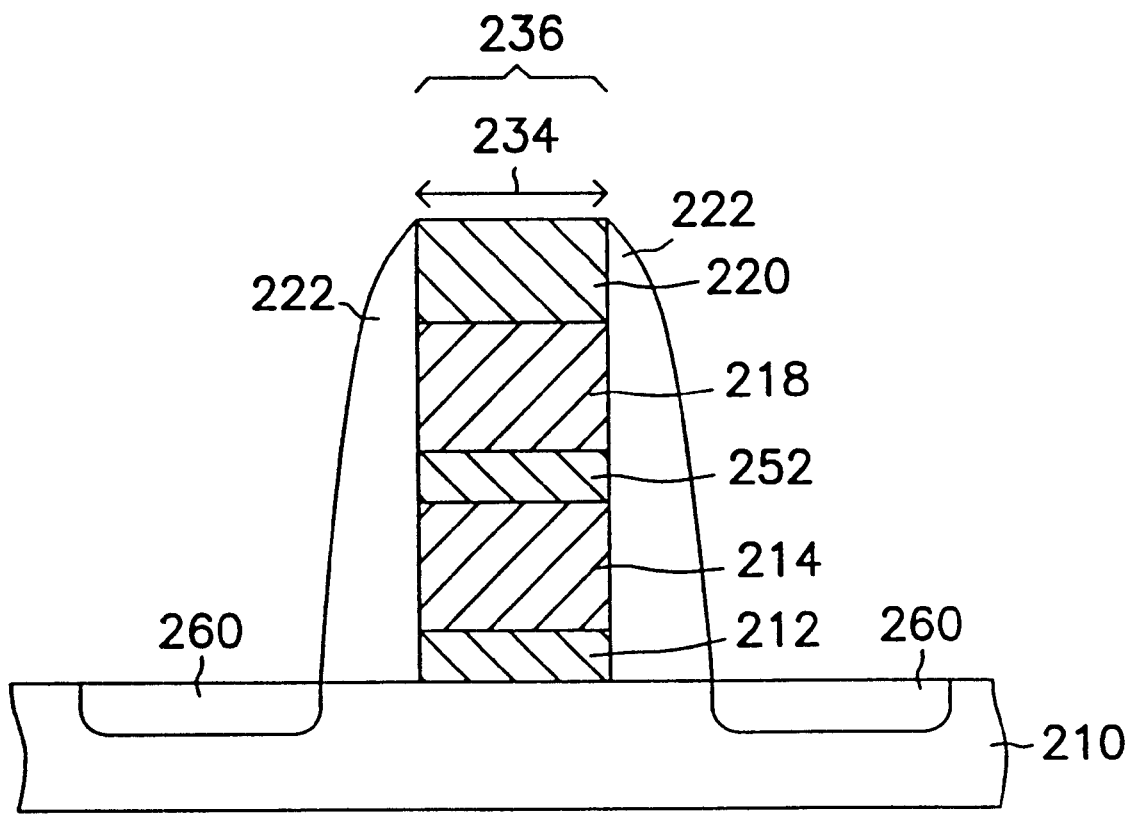

In a further embodiment, subsequent to deposition of titanium 228 and prior to annealing to form $TiSi_2$ 218, a titanium nitride (TiN) cap 254 is formed, as shown in FIG. 1E. Such a layer 254 is typically approximately 25 nanometers thick, deposited using physical vapor deposition (PVD). As the $TiSi_2$ 218 boundary advances, reduced oxygen atoms 250 (i.e., $TiO_x$) are "snow-plowed" towards the outer $TiSi_2$ 218 surface due to more favorable $TiSi_2$ 218 formation, as shown in FIG. 1F. This "thin snowplow" phenomenon produces a high quality $TiSi_2$ film 218. Only a light nitridation layer 252 remains at the $TiSi_2/Si$ (or polysilicon) interface. The TiN cap 254 remains interposed on the outside surface of the word line stack. The TiN cap 254 and the $TiO_x$ layer 250 can then be stripped away with a suitable acid. Subsequent process steps comprise depositing a cap dielectric 220, such as silicon oxide or silicon nitride, and etching to define a word line stack 236 and forming oxide spacers 222 alongside the word line stack 236, as shown in FIG. 1G. The line width 234 of a word line is equal to the width 234 of the word line stack 236. Conventional source/drain implantation forms implanted regions 260 self-aligned with the oxide spacers 222.

In still further embodiments of the invention, a nitride layer is formed on a second diffusion barrier layer interposed between the bottom silicon layer and the conductor layer in a word line stack. Such diffusion barrier layers are well known to one skilled in the art. Further variations will be apparent to one skilled in the art.

We claim:

1. A semiconductor transistor structure, comprising:
   a semiconductor substrate;
   a gate oxide layer coupled to the semiconductor substrate;
   a bottom silicon layer coupled to the gate oxide layer;
   a conductor layer adjacent to the bottom silicon layer;
   a diffusion barrier layer interposed between the bottom silicon layer and the conductor layer; and
   a thin nitride layer interposed between the bottom silicon layer and the conductor layer.

2. The structure of claim 1, wherein the nitride layer has a thickness of a few atomic layers.

3. The structure of claim 1, wherein the thin nitride layer has a thickness of approximately less than 20 to 50 angstroms.

4. The structure of claim 1, wherein the bottom silicon layer comprises a material selected from the group consisting of intrinsic silicon, intrinsic polysilicon, doped silicon, and doped polysilicon.

5. A semiconductor memory device, comprising:
   a plurality of memory cells;
   a plurality of access transistors coupled to the plurality of memory cells; and
   at least one word line coupled to the plurality of access transistors, wherein the at least one word line is formed over a gate oxide layer by a method comprising:
      forming a bottom silicon layer over the gate oxide layer;
      forming a diffusion barrier layer over the bottom silicon layer;
      forming a nitrogen-doped silicon oxide layer over the diffusion barrier layer;
      forming a titanium layer on the nitrogen-doped silicon oxide layer; and
      annealing the titanium layer to form a titanium silicide conductor layer and a thin nitride layer interposed between the diffusion barrier layer and the refractory metal silicide conductor layer, and wherein the nitride layer has a thickness of a few atomic layers.

6. The device of claim 5, wherein the nitride layer has a thickness of approximately less than 20 to 50 angstroms.

7. The device of claim 5, wherein the bottom silicon layer comprises a material selected from the group consisting of intrinsic silicon, intrinsic polysilicon, doped silicon, and doped polysilicon.

8. A semiconductor memory device, comprising:
   a plurality of memory cells;
   a plurality of access transistors coupled to the plurality of memory cells; and
   at least one word line coupled to the plurality of access transistors, wherein the at least one word line is formed over a gate oxide layer by a method comprising:
      forming a bottom silicon layer over the gate oxide layer;
      forming a diffusion barrier layer over the bottom silicon layer;
      forming a silicon oxide layer over the diffusion barrier layer;
      annealing the silicon oxide layer in a nitrogen-containing ambient to form a nitrogen-doped silicon oxide layer;
      forming a titanium layer on the nitrogen-doped silicon oxide layer; and
      annealing the titanium layer to form a titanium silicide conductor layer and a thin nitride layer interposed between diffusion barrier layer and the refractory metal silicide conductor layer, and wherein the nitride layer has a thickness of a few atomic layers.

9. The semiconductor memory device of claim 8, wherein the nitrogen-containing ambient comprises at least one material selected from the group consisting of $N_2O$, NO and $NH_3$.

10. The semiconductor memory device of claim 8, wherein the bottom silicon layer comprises a material selected from the group consisting of intrinsic silicon, intrinsic polysilicon, doped silicon, and doped polysilicon.

11. The device of claim 8, wherein the nitride layer has a thickness of approximately less than 20 to 50 angstroms.

12. The device of claim 8, wherein the thin nitride layer has a low nitrogen concentration of approximately $10^{13}$ ions/$cm^3$.

13. The device of claim 8, wherein the thin nitride layer has a low nitrogen concentration of approximately 1.4 percent by volume of nitrogen atoms.

14. The device of claim 8, wherein the thin nitride layer has a low nitrogen concentration of approximately 5.4 percent by volume of nitrogen atoms.

15. A semiconductor transistor structure, comprising:
   a substrate;
   a gate oxide layer coupled to the substrate;
   a bottom silicon layer coupled to the gate oxide layer;
   a nitride layer coupled to the bottom silicon layer;
   a diffusion barrier layer interposed between the nitride layer and the bottom silicon layer; and
   a refractory metal silicide layer coupled to the nitride layer, wherein the refractory metal silicide layer is produced from a reaction of a refractory metal layer and a nitrogen-doped silicon oxide layer, further wherein the nitride layer is a residual of the nitrogen-doped silicon oxide layer after the reaction with the refractory metal layer, and wherein the nitride layer has a thickness of a few atomic layers.

16. The structure of claim 15, wherein the nitride layer has a thickness of approximately less than 20 to 50 angstroms.

17. The structure of claim 15, wherein the nitride layer has a low nitrogen concentration of approximately $10^{13}$ ions/$cm^3$.

18. The structure of claim 15, wherein the nitride layer has a low nitrogen concentration of approximately 1.4 percent by volume of nitrogen atoms.

19. The structure of claim 15, wherein the nitride layer has a low nitrogen concentration of approximately 5.4 percent by volume of nitrogen atoms.

20. A semiconductor transistor structure, comprising:
   a substrate;
   a gate oxide layer coupled to the substrate;
   a bottom silicon layer coupled to the gate oxide layer;
   a refractory metal silicide layer, wherein the refractory metal silicide layer is produced from a reaction of a refractory metal layer and a nitrogen-doped silicon oxide layer;
   a nitride layer interposed between the refractory metal silicide layer and the bottom silicon layer, wherein the nitride layer is a residual of the nitrogen-doped silicon oxide layer after the reaction with the refractory metal layer, and wherein the nitride layer has a thickness of a few atomic layers; and
   a diffusion barrier layer interposed between the nitride layer and the bottom silicon layer.

21. The structure of claim 20, wherein the nitride layer has a thickness of approximately less than 20 to 50 angstroms.

22. The stricture of claim 20, wherein the nitride layer has a low nitrogen concentration of approximately $10^{13}$ ions/$cm^3$.

23. The structure of claim 20, wherein the nitride layer has a low nitrogen concentration of approximately 1.4 percent by volume of nitrogen atoms.

24. The structure of claim 20, wherein the nitride layer has a low nitrogen concentration of approximately 5.4 percent by volume of nitrogen atoms.

25. A semiconductor transistor structure, comprising:
   a semiconductor substrate;
   a gate oxide layer coupled to the semiconductor substrate;
   a bottom silicon layer coupled to the gate oxide layer;
   a conductor layer adjacent to the bottom silicon layer;

a diffusion barrier layer interposed between the bottom silicon layer and the conductor layer; and a light, thin nitride layer interposed between the bottom silicon layer and the conductor layer.

26. The structure of claim 25, wherein the light, thin nitride layer has a nitrogen content of approximately $10^{13}$ ions/cm$^3$.

27. The structure of claim 25, wherein the light, thin nitride layer has a nitrogen concentration of approximately 1.4 percent by volume of nitrogen atoms.

28. The structure of claim 25, wherein the light, thin nitride layer has a nitrogen concentration of approximately 5.4 percent by volume of nitrogen atoms.

29. A semiconductor memory device, comprising:

a plurality of memory cells;

a plurality of access transistors coupled to the plurality of memory cells; and at least one word line coupled to the plurality of access transistors, wherein the at least one word line is formed over a gate oxide layer by a method comprising:

forming a bottom silicon layer over the gate oxide layer;

forming a diffusion barrier layer over the bottom silicon layer;

forming a lightly nitrogen-doped, thin silicon oxide layer over the diffusion barrier layer;

forming a titanium layer on the nitrogen-doped silicon oxide layer; and annealing the titanium layer to form a titanium silicide conductor layer and a thin, light nitride layer interposed between the diffusion barrier layer and the refractory metal silicide conductor layer, and wherein the thin, light nitride layer has a thickness of a few atomic layers.

30. The device of claim 29, wherein the thin, light nitride layer has a nitrogen content of approximately $10^{13}$ ions/cm$^3$.

31. The device of claim 29, wherein the thin, light nitride layer has a nitrogen concentration of approximately 1.4 percent by volume of nitrogen atoms.

32. The device of claim 29, wherein the thin, light nitride layer has a nitrogen concentration of approximately 5.4 percent by volume of nitrogen atoms.

* * * * *